US011842773B2

(12) United States Patent
Choi

(10) Patent No.: US 11,842,773 B2
(45) Date of Patent: Dec. 12, 2023

(54) PAGE BUFFER, SEMICONDUCTOR MEMORY DEVICE WITH PAGE BUFFER, AND METHOD OF OPERATING SEMICONDUCTOR MEMORY DEVICE

(71) Applicant: SK hynix Inc., Icheon-si (KR)

(72) Inventor: Hyung Jin Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 147 days.

(21) Appl. No.: 17/525,476

(22) Filed: Nov. 12, 2021

(65) Prior Publication Data

US 2022/0230691 A1    Jul. 21, 2022

(30) Foreign Application Priority Data

Jan. 18, 2021  (KR) .......................... 10-2021-0006930

(51) Int. Cl.
| G11C 16/04 | (2006.01) |
| G11C 16/24 | (2006.01) |
| G11C 11/56 | (2006.01) |
| G11C 16/34 | (2006.01) |
| G11C 16/10 | (2006.01) |

(52) U.S. Cl.
CPC .......... G11C 16/24 (2013.01); G11C 11/5628 (2013.01); G11C 11/5671 (2013.01); G11C 16/10 (2013.01); G11C 16/3459 (2013.01)

(58) Field of Classification Search
CPC . G11C 16/24; G11C 11/5628; G11C 11/5671; G11C 16/10; G11C 16/3459; G11C 16/30; G11C 2211/5621; G11C 16/08; G11C 16/12; G11C 16/0483; G11C 16/3404

USPC .................................................... 365/185.03
See application file for complete search history.

(56) References Cited

U.S. PATENT DOCUMENTS

| 9,165,672 | B2 * | 10/2015 | Kang ................. G11C 16/3459 |
| 10,510,424 | B2 * | 12/2019 | Lee ......................... G11C 16/08 |
| 10,535,389 | B2 * | 1/2020 | Yun ..................... G11C 11/4087 |
| 10,566,067 | B2 * | 2/2020 | Lee ......................... G11C 16/10 |
| 10,607,688 | B2 * | 3/2020 | Shin ........................ G11C 8/08 |
| 10,910,065 | B2 * | 2/2021 | Hong .................... G11C 29/028 |
| 2018/0113758 | A1 * | 4/2018 | Choo ..................... G11C 29/42 |

FOREIGN PATENT DOCUMENTS

| KR | 1020130038527 A | 4/2013 |
| KR | 1020160029215 A | 3/2016 |

* cited by examiner

*Primary Examiner* — Tha-O H Bui
(74) *Attorney, Agent, or Firm* — WILLIAM PARK & ASSOCIATES LTD.

(57) ABSTRACT

Provided herein is a page buffer, a semiconductor memory device with the page buffer, and a method of operating the semiconductor memory device. The page buffer includes a plurality of data latch components coupled to a sensing node, a bit line controller coupled between a bit line and the sensing node, the bit line controller configured to control a node value of the sensing node based on a program state of a memory cell that is coupled to the bit line during a program verify operation, and a sub-latch component configured to latch verification data based on the node value during the program verify operation, wherein each data latch component sets the node value to a first logic value when a program state that corresponds to program data has a threshold voltage distribution that is higher than that in a target program state during the program verify operation.

18 Claims, 15 Drawing Sheets

FIG. 10A

| | | TARGET PROGRAM STATE | | | | | | | |
|---|---|---|---|---|---|---|---|---|---|
| | | E | P1 | P2 | P3 | P4 | P5 | P6 | P7 |
| QS_N | FAIL-MC | | 1 | 1 | 1 | 1 | 1 | 1 | 1 |
| | PASS-MC | 0 | 0 | 0 | 0 | 0 | 0 | 0 | 0 |

FIG. 10B

| | | TARGET PROGRAM STATE | | | | | | | |
|---|---|---|---|---|---|---|---|---|---|
| | | E | P1 | P2 | P3 | P4 | P5 | P6 | P7 |
| S0 | FAIL-MC | | 1 | 1 | 1 | 1 | 1 | 1 | 1 |
| | PASS-MC | 0 | 0 | 0 | 0 | 0 | 0 | 0 | 0 |

FIG. 10C

| | | TARGET PROGRAM STATE | | | | | | | |
|---|---|---|---|---|---|---|---|---|---|
| | | E | P1 | P2 | P3 | P4 | P5 | P6 | P7 |
| S0 | FAIL-MC | | 1 | 1→0 | 1→0 | 1→0 | 1→0 | 1→0 | 1→0 |
| | PASS-MC | 0 | 0 | 0 | 0 | 0 | 0 | 0 | 0 |

SET DATA VALUE OF S0 NODE TO "0"

FIG. 10D

| | | TARGET PROGRAM STATE | | | | | | | |
|---|---|---|---|---|---|---|---|---|---|
| | | E | P1 | P2 | P3 | P4 | P5 | P6 | P7 |
| QS_N | FAIL-MC | | 1 | 1 | 1 | 1 | 1 | 1 | 1 |
| | PASS-MC | 0 | 0 | 0 | 0 | 0 | 0 | 0 | 0 |

MAINTAIN PREVIOUS DATA VALUE

FIG. 10E

| | | TARGET PROGRAM STATE | | | | | | |
|---|---|---|---|---|---|---|---|---|
| | | E | P1 | P2 | P3 | P4 | P5 | P6 | P7 |
| S0 | FAIL-MC | | 1 | 1 | 1 | 1 | 1 | 1 | 1 |
| | PASS-MC | 0 | 0 | 0 | 0 | 0 | 0 | 0 | 0 |

FIG. 10F

| | | TARGET PROGRAM STATE | | | | | | |
|---|---|---|---|---|---|---|---|---|
| | | E | P1 | P2 | P3 | P4 | P5 | P6 | P7 |
| S0 | FAIL-MC | | 0 | 1 | 1→0 | 1→0 | 1→0 | 1→0 | 1→0 |
| | PASS-MC | 0 | 0 | 0 | 0 | 0 | 0 | 0 | 0 |

SET DATA VALUE OF S0 NODE TO "0"

FIG. 10G

|      |         | TARGET PROGRAM STATE |    |    |    |    |    |    |    |
|------|---------|----|----|----|----|----|----|----|----|
|      |         | E  | P1 | P2 | P3 | P4 | P5 | P6 | P7 |
| QS_N | FAIL-MC |    | 1  | 1  | 1  | 1  | 1  | 1  | 1  |
|      | PASS-MC | 0  | 0  | 0  | 0  | 0  | 0  | 0  | 0  |

MAINTAIN PREVIOUS DATA VALUE (P3–P7)

PAGE BUFFER, SEMICONDUCTOR MEMORY DEVICE WITH PAGE BUFFER, AND METHOD OF OPERATING SEMICONDUCTOR MEMORY DEVICE

CROSS-REFERENCE TO RELATED APPLICATION

The present application claims priority under 35 U.S.C. § 119(a) to Korean patent application number 10-2021-0006930, filed on Jan. 18, 2021, which is incorporated herein by reference in its entirety.

BACKGROUND

1. Technical Field

Various embodiments of the present disclosure relate to an electronic device, and more particularly to a page buffer, a semiconductor memory device with the page buffer, and a method of operating the semiconductor memory device.

2. Related Art

Semiconductor memory devices are memory devices that are embodied by using a semiconductor, such as silicon (Si), germanium (Ge), gallium arsenide (GaAs), or indium phosphide (InP). Semiconductor memory devices are classified into a volatile memory device and a nonvolatile memory device.

The volatile memory device is a memory device in which stored data is lost when power supply is interrupted. Representative examples of the volatile memory device include a static random access memory (SRAM), a dynamic RAM (DRAM), and a synchronous DRAM (SDRAM). The nonvolatile memory device is a memory device in which stored data is retained even when power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change RAM (PRAM), a magnetic RAM (MRAM), a resistive RAM (RRAM), and a ferroelectric RAM (FRAM). The flash memory is chiefly classified into a NOR type and a NAND type.

SUMMARY

An embodiment of the present disclosure may provide for a page buffer. The page buffer may include a plurality of data latch components coupled to a sensing node, the plurality of data latch components configured to store program data, a bit line controller coupled between a bit line and the sensing node, the bit line controller configured to control a node value of the sensing node based on a program state of a memory cell that is coupled to the bit line during a program verify operation, and a sub-latch component configured to latch verification data based on the node value of the sensing node during the program verify operation, wherein each of the plurality of data latch components sets the node value of the sensing node to a first logic value when a program state that corresponds to the program data has a threshold voltage distribution that is higher than a threshold voltage distribution of a target program state during the program verify operation.

An embodiment of the present disclosure may provide for a semiconductor memory device. The semiconductor memory device may include a memory block including a plurality of memory cells, a plurality of page buffers coupled to a plurality of bit lines of the memory block, and a voltage generator configured to apply a program voltage to a selected word line of the memory block during a program pulse apply operation and configured to apply a verify voltage to the selected word line during a program verify operation, wherein each of the plurality of page buffers is configured to temporarily store program data to be programmed to any one of the plurality of memory cells, control a node value of a sensing node based on a program state of the one memory cell during the program verify operation, latch verification data based on the node value of the sensing node, and set the node value of the sensing node to a specific value when the program data corresponds to a program state with a threshold voltage distribution that is higher than a threshold voltage distribution of a program state that corresponds to the program verify operation.

An embodiment of the present disclosure may provide for a method of operating a semiconductor memory device. The method may include storing program data in a plurality of page buffers, applying a program permission voltage or a program inhibition voltage to bit lines that are coupled to memory cells based on the program data that is stored in the plurality of page buffers, applying a program voltage to a word line of the memory cells, selectively precharging the bit lines based on previous verification data that is stored in a sub-latch component of each of the plurality of page buffers, applying a first verify voltage that corresponds to a first program state to the word line, controlling a node value of a sensing node of each of the page buffers based on a program state of the memory cells, setting the node value of the sensing node to a specific value or maintaining the node value of the sensing node based on the program data that is stored in each of the plurality of page buffers, and latching verification data or maintaining the previous verification data based on the node value of the sensing node.

BRIEF DESCRIPTION OF THE DRAWINGS

FIGS. 10A to 10G are diagrams for explaining data values of a node QS_N of a sub-latch component and a sensing node SO during a plurality of program verify operations that are successively performed.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

Various embodiments of the present disclosure will now be described more fully hereinafter with reference to the accompanying drawings, in which preferred embodiments of the present disclosure are shown, so that those skilled in the art can easily practice the technical spirit of the present disclosure.

Various embodiments of the present disclosure are directed to a page buffer that is capable of reducing the time required for a program operation, a semiconductor memory device with the page buffer, and a method of operating the semiconductor memory device.

Figure 1:
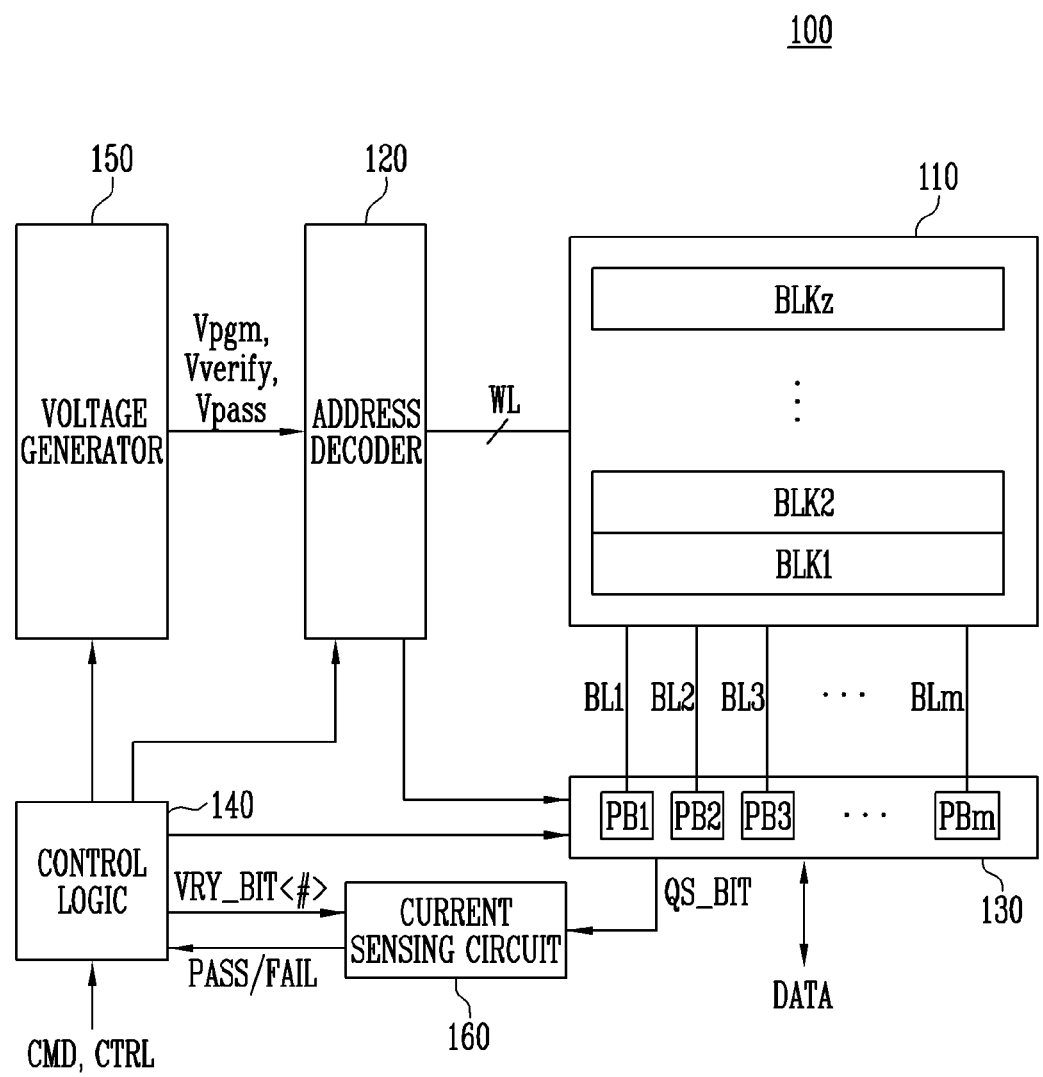
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device 100 includes a memory cell array 110, an address decoder 120, a read and write circuit 130, a control logic 140, a voltage generator 150, and a current sensing circuit 160.

The memory cell array 110 may include a plurality of memory blocks BLK1 to BLKz. The memory blocks BLK1 to BLKz may be coupled to the address decoder 120 through word lines WL. The memory blocks BLK1 to BLKz may be coupled to the read and write circuit 130 through bit lines BL1 to BLm. Each of the memory blocks BLK1 to BLKz may include a plurality of memory cells. In an embodiment, the plurality of memory cells may be nonvolatile memory cells and may be implemented as nonvolatile memory cells with a vertical channel structure. The memory cell array 110 may be implemented as a memory cell array with a two-dimensional (2D) structure. In an embodiment, the memory cell array 110 may be implemented as a memory cell array with a three-dimensional (3D) structure. Meanwhile, each of the memory cells that are included in the memory cell array may store at least one bit of data. In an embodiment, each of the memory cells that are included in the memory cell array 110 may be a single-level cell (SLC), which stores 1-bit data. In an embodiment, each of the memory cells that are included in the memory cell array 110 may be a multi-level cell (MLC), which stores 2-bit data. In an embodiment, each of the memory cells that are included in the memory cell array 110 may be a triple-level cell (TLC), which stores 3-bit data. In an embodiment, each of the memory cells that are included in the memory cell array 110 may be a quad-level cell (QLC), which stores 4-bit data. In accordance with an embodiment, the memory cell array 110 may include a plurality of memory cells each of which stores 5 or more bits of data.

The address decoder 120 may be coupled to the memory cell array 110 through the word lines WL. The address decoder 120 may be operated based on the control logic 140. The address decoder 120 may receive addresses through an input/output buffer (not illustrated) that is provided in the semiconductor memory device 100.

The address decoder 120 may decode a block address, among the received addresses. The address decoder 120 may select at least one memory block based on the decoded block address. Also, during a program pulse apply operation of a program operation, the address decoder 120 may apply a program voltage Vpgm that is generated by the voltage generator 150 to a selected word line of a selected memory block and may apply a pass voltage Vpass to the remaining word lines, that is, unselected word lines. Further, during a program verify operation, the address decoder 120 may apply a verify voltage Vverify, generated by the voltage generator 150, to the selected word line of the selected memory block and may apply the pass voltage Vpass to the remaining word lines, that is, unselected word lines.

The address decoder 120 may decode a column address, among the received addresses. The address decoder 120 may transmit the decoded column address to the read and write circuit 130.

The program and read operations of the semiconductor memory device 100 may be each performed on a page basis. Addresses that are received in response to requests for the program and read operations may include a block address, a row address, and a column address. The address decoder 120 may select one memory block and one word line in accordance with the block address and the row address. The column address may be decoded by the address decoder 120 and may then be provided to the read and write circuit 130. In the present specification, memory cells that are coupled to one word line may be referred to as a "physical page."

The read and write circuit 130 may include a plurality of page buffers PB1 to PBm. The read and write circuit 130 may be operated as a "read circuit" during a read operation of the memory cell array 110 and as a "write circuit" during a write operation thereof. The plurality of page buffers PB1 to PBm may be coupled to the memory cell array 110 through the bit lines BL1 to BLm.

During a program operation, the page buffers PB1 to PBm may temporarily store data DATA to be programmed, which is received from an external device, and may control the potential levels of corresponding bit lines BL1 to BLm in accordance with the temporarily stored program data DATA.

In order to sense threshold voltages of the memory cells during a program verify operation, each of the page buffers PB1 to PBm may sense, through a sensing node, a change in the amount of flowing current based on the program state of a corresponding memory cell and latch the sensed change as sensing data while continuously supplying a sensing current to the bit lines that are coupled to the memory cells.

When a plurality of program verify operations that respectively correspond to a plurality of program states are successively performed, the plurality of page buffers PB1 to PBm may accumulate and latch pieces of data that correspond to the results of the program verify operations that have been completed. For example, among the plurality of page buffers PB1 to PBm, page buffers which temporarily store pieces of data that correspond to program states for which program verify operations have been performed may latch the data that corresponds to the results of the performed program verify operations. Also, among the plurality of page buffers PB1 to PBm, page buffers that temporarily store pieces of data that correspond to program states for which program verify operations are not performed may perform a masking operation so that they do not latch data during the performed program verify operations.

That is, each of the plurality of page buffers PB1 to PBm may temporarily store data that corresponds to any one of an erased state and a plurality of program states during a program operation, and each of the plurality of page buffers PB1 to PBm may latch data that corresponds to the result of program verification during a program verify operation for the program state that corresponds to the temporarily stored data, among the plurality of program verify operations. Each of the plurality of page buffers PB1 to PBm may perform a masking operation so that data that corresponds to the result of program verification is not latched during a program verify operation for a program state that does not correspond to the temporarily stored data, among the plurality of program verify operations.

The plurality of page buffers PB1 to PBm may generate a verification data bit QS_BIT based on the result of program verification.

The read and write circuit 130 may be operated in response to page buffer control signals that are output from the control logic 140.

The control logic 140 may be coupled to the address decoder 120, the read and write circuit 130, and the current sensing circuit 160. The control logic 140 may receive a command CMD and a control signal CTRL through the input/output buffer (not illustrated) of the semiconductor memory device 100. The control logic 140 may control the overall operation of the semiconductor memory device 100 in response to the control signal CTRL.

The control logic 140 may control a peripheral circuit to sequentially program a plurality of program states during a program operation. The control logic 140 may control the peripheral circuit to sequentially perform a plurality of program loops during a program operation, and each of the program loops may include one program pulse apply operation and at least one program verify operation.

The control logic 140 may determine whether a program verify operation for a specific target program state has passed or failed in response to a pass signal PASS or a fail signal FAIL that is received from the current sensing circuit 160. The control logic 140 may set a program verify operation to be performed in a next program loop based on the result of the program verify operation. For example, when it is determined that the result of a first program verify operation that is included in a current program loop indicates a fail, the control logic 140 may set program loops so that the first program verify operation is included in the next program loop. However, when it is determined that the result of the first program verify operation that is included in the current program loop indicates a pass, the control logic 140 may set program loops so that a program verify operation that is subsequent to the first program verify operation is performed first in the next program loop.

In response to a control signal that is output from the control logic 140, the voltage generator 150 may generate the program voltage Vpgm and the pass voltage Vpass during the program pulse apply operation of the program operation and may generate the verify voltage Vverify and the pass voltage Vpass during the program verify operation of the program operation. The verify voltage Vverify may include a plurality of voltages that respectively correspond to a plurality of program states.

The current sensing circuit 160 may generate a reference current in response to an enable bit VRY_BTI<#> that is received from the control logic 140 during a current sensing operation. Further, the current sensing circuit 160 may generate a verify current based on the verification data bit QS_BIT that is received from the page buffers PB1 to PBm that are included in the read and write circuit 130 and may output a pass signal PASS or a fail signal FAIL by comparing the reference current with the verify current.

The address decoder 120, the read and write circuit 130, and the voltage generator 150 may function as a "peripheral circuit" that performs a read operation, a program operation, and an erase operation on the memory cell array 110. The peripheral circuit may perform the read operation, the program operation, and the erase operation on the memory cell array 110 based on the control logic 140.

Figure 2:
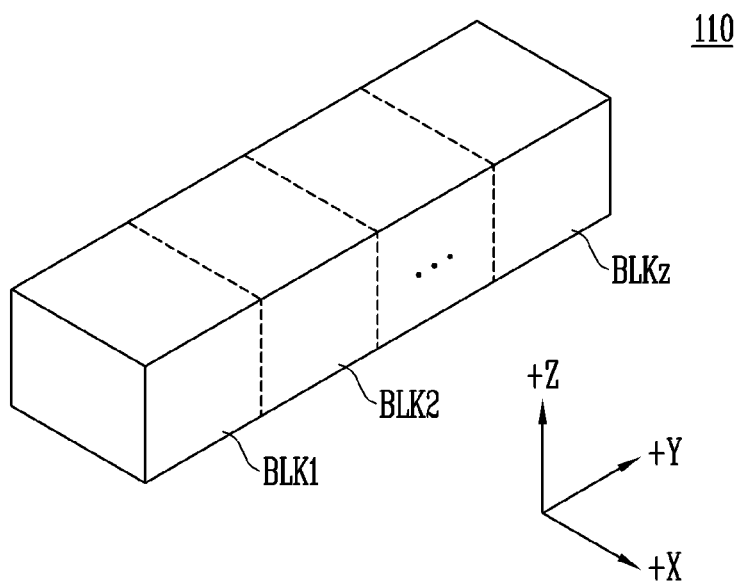
FIG. 2 is a diagram illustrating an embodiment of a memory cell array of FIG. 1.

FIG. 2 is a block diagram illustrating an embodiment of the memory cell array 110 of FIG. 1.

Referring to FIG. 2, the memory cell array 110 may include a plurality of memory blocks BLK1 to BLKz. Each memory block may have a three-dimensional (3D) structure. Each of the memory blocks may include a plurality of memory cells stacked on a substrate. The plurality of memory cells may be arranged in +X, +Y, and +Z directions. The structure of each memory block will be described in more detail below with reference to FIGS. 3 and 4.

Figure 3:
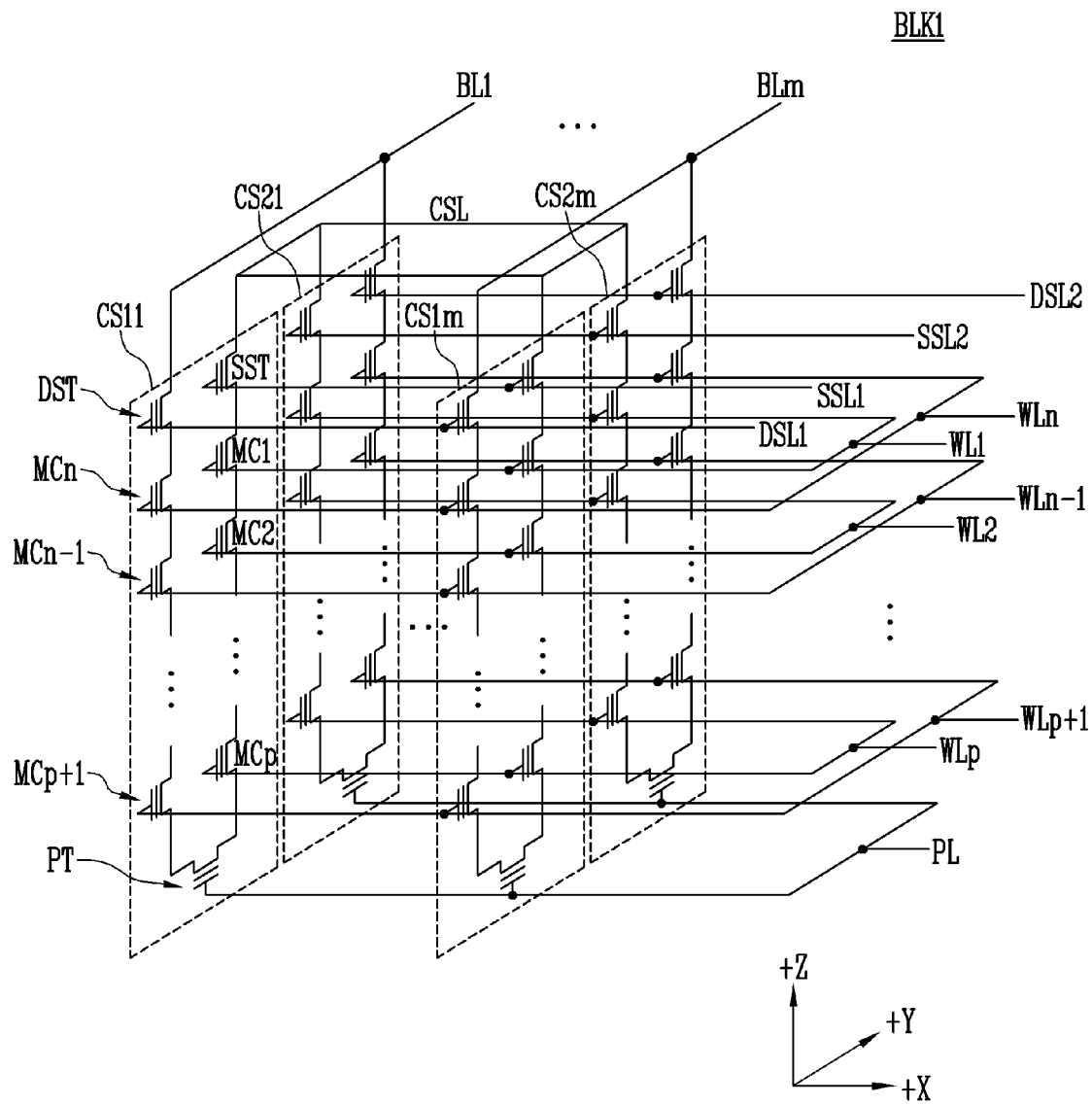
FIG. 3 is a circuit diagram illustrating any one memory block BLK1 of memory blocks BLK1 to BLKz of FIG. 2.

FIG. 3 is a circuit diagram illustrating any one memory block BLK1 of memory blocks BLK1 to BLKz of FIG. 2.

Referring to FIG. 3, the memory block BLK1 may include a plurality of cell strings CS11 to CS1$m$ and CS21 to CS2$m$. In an embodiment, each of the cell strings CS11 to CS1$m$ and CS21 to CS2$m$ may be formed in a 'U' shape. In the memory block BLK1, m cell strings may be arranged in a row direction (i.e., a positive (+) X direction). In FIG. 3, two cell strings are illustrated as being arranged in a column direction (i.e., a positive (+) Y direction). However, this illustration is made for convenience of description, and it will be understood that three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string may be coupled between the common source line CSL and the memory cells MC1 to MCp.

In an embodiment, source select transistors of cell strings that are arranged in the same row may be coupled to a source select line that extends in a row direction, and source select transistors of cell strings that are arranged in different rows may be coupled to different source select lines. In FIG. 3, source select transistors of the cell strings CS11 to CS1$m$ in a first row may be coupled to a first source select line SSL1. Source select transistors of the cell strings CS21 to CS2$m$ in a second row may be coupled to a second source select line SSL2.

In an embodiment, source select transistors of the cell strings CS11 to CS1$m$ and CS21 to CS2$m$ may be coupled in common to one source select line.

The first to n-th memory cells MC1 to MCn in each cell string may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp may be sequentially arranged in an opposite direction to the positive (+) Z direction and may be coupled in series between the source select transistor SST and the pipe transistor PT. The p+1-th to n-th memory cells MCp+1 to MCn may be sequentially arranged in the +Z direction and may be coupled in series between the pipe transistor PT and the drain select transistor DST. The first to p-th memory cells MC1 to MCp and the p+1-th to n-th memory cells MCp+1 to MCn may be coupled to each other through the pipe transistor PT. Gates of the first to n-th memory cells MC1 to MCn of each cell string may be coupled to first to n-th word lines WL1 to WLn, respectively.

A gate of the pipe transistor PT of each cell string may be coupled to a pipeline PL.

The drain select transistor DST of each cell string may be coupled between the corresponding bit line and the memory cells MCp+1 to MCn. The cell strings that are arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings that are arranged in the column direction may be coupled to bit lines that extend in the column direction. In FIG. 3, the cell strings CS11 and CS21 in a first column may be coupled to a first bit line BL1. Cell strings CS1m and CS2m in an m-th column may be coupled to an m-th bit line BLm.

Memory cells that are coupled to the same word line in cell strings that are arranged in the row direction form a single page. For example, memory cells that are coupled to the first word line WL1, among the cell strings CS11 to CS1m in the first row, may form a single page. Memory cells that are coupled to the first word line WL1, among the cell strings CS21 to CS2m in the second row, may form another single page. Cell strings that are arranged in the direction of a single row may be selected by selecting any one of the drain select lines DSL1 and DSL2. One page may be selected from the selected cell strings by selecting any one of the word lines WL1 to WLn.

In an embodiment, instead of the first to m-th bit lines BL1 to BLm, even bit lines and odd bit lines may be provided. Even-numbered cell strings, among the cell strings CS11 to CS1m or CS21 to CS2m arranged in a row direction, may be coupled to respective even bit lines. Odd-numbered cell strings, among the cell strings CS11 to CS1m or CS21 to CS2m arranged in the row direction, may be coupled to respective odd bit lines.

In an embodiment, one or more of the first to n-th memory cells MC1 to MCn may be used as dummy memory cells. For example, the one or more dummy memory cells may be provided to reduce the electric field between the source select transistor SST and the memory cells MC1 to MCp. Alternatively, the one or more dummy memory cells may be provided to reduce the electric field between the drain select transistor DST and the memory cells MCp+1 to MCn. As the number of dummy memory cells that are provided increases, the reliability of operation of the memory block BLK1 may be improved, whereas the size of the memory block BLK1 may be increased. As the number of dummy memory cells that are provided decreases, the size of the memory block BLK1 may be decreased, whereas the reliability of operation of the memory block BLK1 may deteriorate.

In order to efficiently control the one or more dummy memory cells, respective dummy memory cells may have required threshold voltages. Before or after an erase operation on the memory block BLK1 is performed, program operations may be performed on all or some of the dummy memory cells. When the erase operation is performed after the program operations have been performed, the respective dummy memory cells may have the required threshold voltages by controlling the voltages that are applied to dummy word lines that are coupled to respective dummy memory cells.

Figure 4:
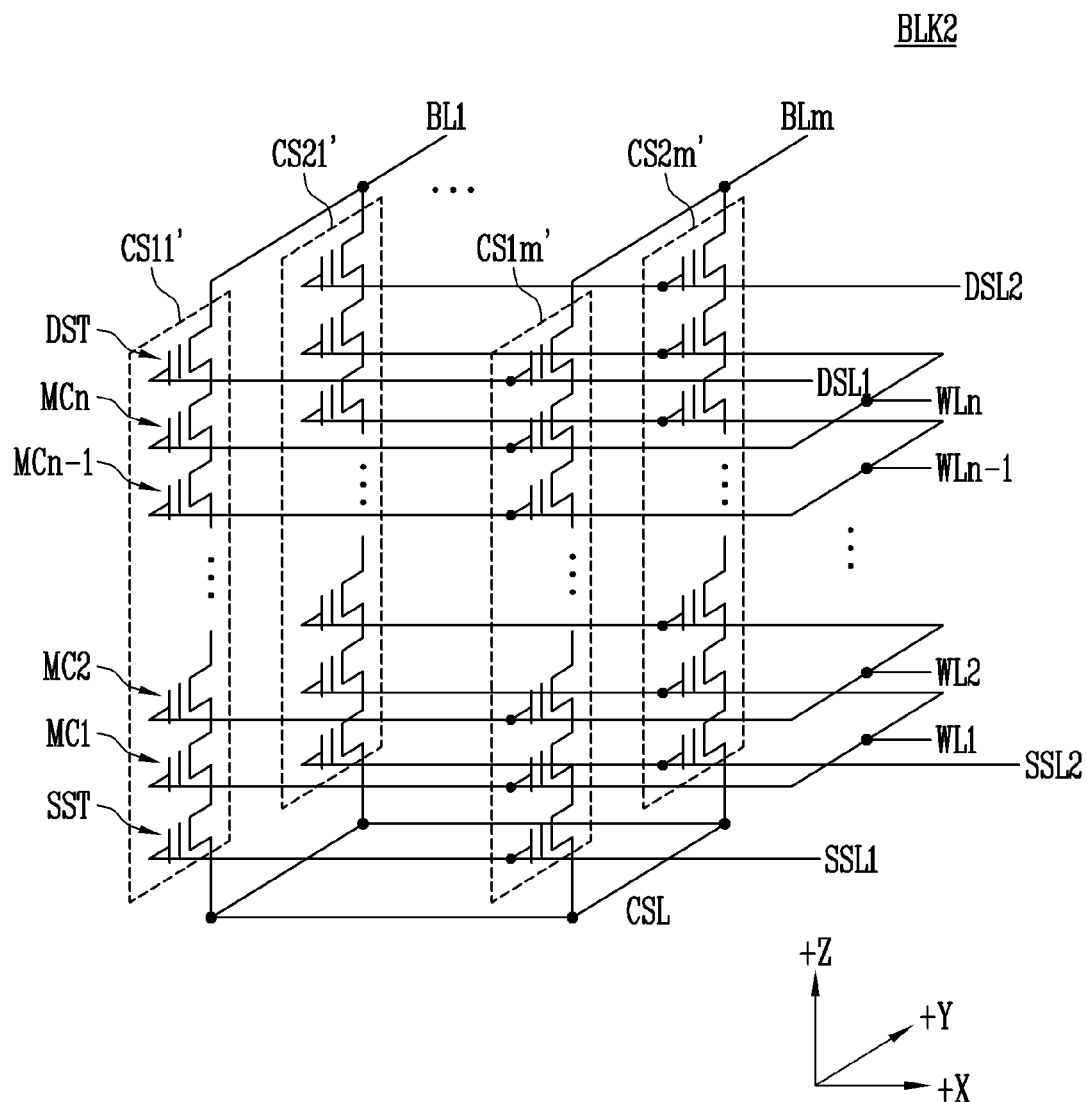
FIG. 4 is a circuit diagram illustrating an example of any one memory block BLK2 of the memory blocks BLK1 to BLKz of FIG. 2.

FIG. 4 is a circuit diagram illustrating an example of any one memory block BLK2 of the memory blocks BLK1 to BLKz of FIG. 2.

Referring to FIG. 4, the memory block BLK2 may include a plurality of cell strings CS11' to CS1m' and CS21' to CS2m'. Each of the plurality of cell strings CS11' to CS1m' and CS21' to CS2m' may extend along a positive Z (+Z) direction. Each of the cell strings CS11' to CS1m' and CS21' to CS2m' may include at least one source select transistor SST, first to n-th memory cells MC1 to MCn, and at least one drain select transistor DST, which are stacked on a substrate (not illustrated) below the memory block BLK2.

The source select transistor SST of each cell string may be connected between a common source line CSL and memory cells MC1 to MCn. The source select transistors of cell strings that are arranged in the same row may be coupled to the same source select line. Source select transistors of cell strings CS11' to CS1m' that are arranged in a first row may be coupled to a first source select line SSL1. Source select transistors of cell strings CS21' to CS2m' that are arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string may be connected in series between the source select transistor SST and the drain select transistor DST. The gates of the first to n-th memory cells MC1 to MCn may be coupled to first to n-th word lines WL1 to WLn, respectively.

The drain select transistor DST of each cell string may be connected between the corresponding bit line and the memory cells MC1 to MCn. Drain select transistors of cell strings that are arranged in a row direction may be coupled to drain select lines extending in a row direction. The drain select transistors of the cell strings CS11' to CS1m' in the first row may be coupled to a first drain select line DSL1. The drain select transistors of the cell strings CS21' to CS2m' in the second row may be coupled to a second drain select line DSL2.

As a result, the memory block BLK2 of FIG. 4 has an equivalent circuit that is similar to that of the memory block BLK1 of FIG. 3. However, a pipe transistor PT is excluded from each cell string for FIG. 4.

In an embodiment, even bit lines and odd bit lines, instead of first to m-th bit lines BL1 to BLm, may be provided. Further, even-numbered cell strings, among the cell strings CS11' to CS1m' or CS21' to CS2m' that are arranged in a row direction, may be coupled to the even bit lines, respectively, and odd-numbered cell strings, among the cell strings CS11' to CS1m' or CS21' to CS2m' that are arranged in the row direction, may be coupled to the odd bit lines, respectively.

In an embodiment, one or more of the first to n-th memory cells MC1 to MCn may be used as dummy memory cells. For example, the one or more dummy memory cells may be provided to reduce the electric field between the source select transistor SST and the memory cells MC1 to MCn. Alternatively, the one or more dummy memory cells may be provided to reduce the electric field between the drain select transistor DST and the memory cells MC1 to MCn. As more dummy memory cells are provided, the reliability of the operation of the memory block BLK2 is improved, but the size of the memory block BLK2 is increased. As fewer memory cells are provided, the size of the memory block BLK2 is reduced, but the reliability of the operation of the memory block BLK2 may deteriorate.

In order to efficiently control the one or more dummy memory cells, each of the dummy memory cells may have a required threshold voltage. Before or after the erase operation of the memory block BLK2 is performed, a program operation may be performed on all or some of the dummy memory cells. When an erase operation is performed after the program operation has been performed, the dummy memory cells may have required threshold voltages by controlling the voltages to be applied to the dummy word lines that are coupled to respective dummy memory cells.

Figure 5:
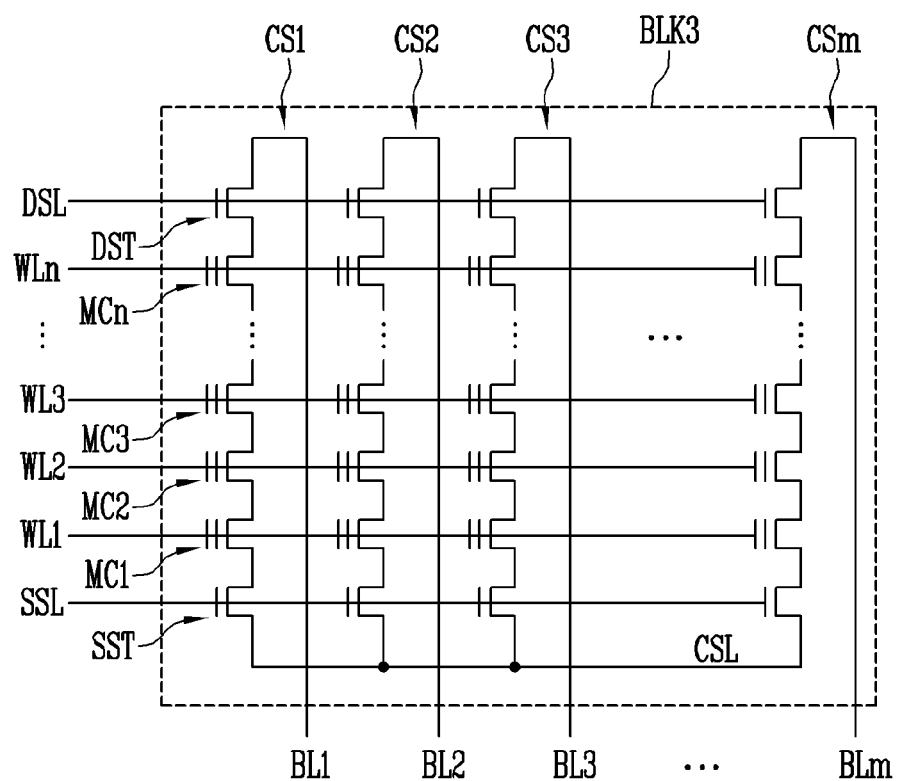
FIG. 5 is a circuit diagram illustrating an example of any one memory block BLK3 of the memory blocks BLK1 to BLKz included in a memory cell array 110 of FIG. 1.

FIG. 5 is a circuit diagram illustrating an example of any one memory block BLK3 of the memory blocks BLK1 to BLKz included in the memory cell array 110 of FIG. 1.

Referring to FIG. 5, the memory block BLK3 may include a plurality of cell strings CS1 to CSm. The plurality of cell strings CS1 to CSm may be coupled to a plurality of bit lines BL1 to BLm, respectively. Each of the cell strings CS1 to CSm may include at least one source select transistor SST, first to n-th memory cells MC1 to MCn, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string may be coupled between a common source line CSL and the memory cells MC1 to MCn.

The first to n-th memory cells MC1 to MCn in each cell string may be coupled between the source select transistor SST and the drain select transistor DST.

The drain select transistor DST of each cell string may be coupled between the corresponding bit line and the memory cells MC1 to MCn.

The memory cells that are coupled to the same word line may constitute a single page. The cell strings CS1 to CSm may be selected by selecting the drain select line DSL. One page may be selected from the selected cell strings by selecting any one of the word lines WL1 to WLn.

In other embodiments, even bit lines and odd bit lines may be provided instead of the first to m-th bit lines BL1 to BLm. Among the cell strings CS1 to CSm, even-numbered cell strings may be coupled to the even bit lines, respectively, and odd-numbered cell strings may be coupled to the odd bit lines, respectively.

As described above, memory cells that are coupled to one word line may form one physical page. In the example of FIG. 5, among memory cells belonging to the memory block BLK3, m memory cells that are coupled to any one of the plurality of word lines WL1 to WLn forms one physical page.

The memory cell array 110 of the semiconductor memory device 100 may be configured in a 3D structure, as illustrated in FIGS. 2 to 4, or may be configured in a 2D structure, as illustrated in FIG. 5.

Figure 6:
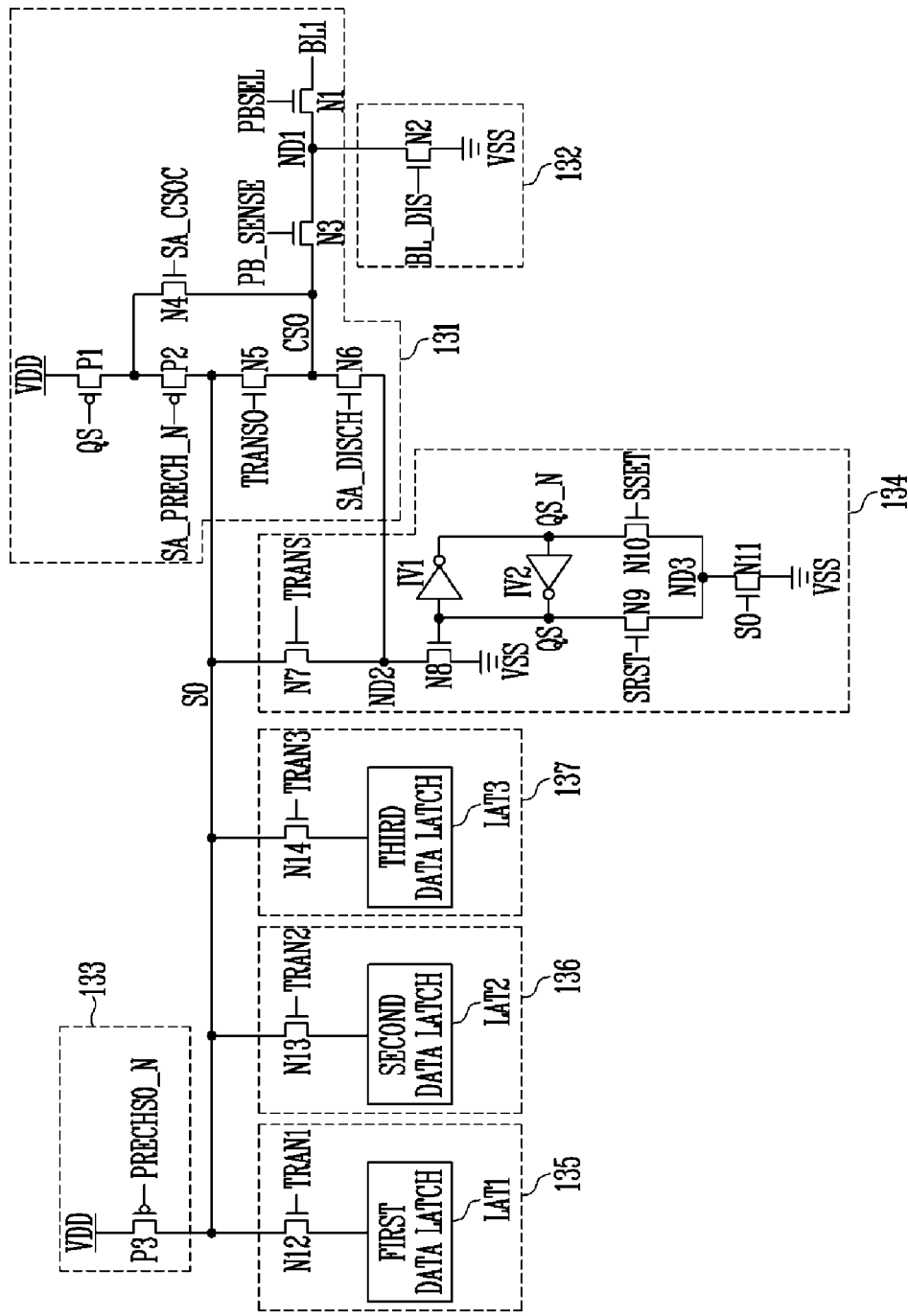
FIG. 6 is a circuit diagram for explaining a page buffer of FIG. 1.

FIG. 6 is a circuit diagram for explaining a page buffer of FIG. 1.

The page buffers PB1 to PBm of FIG. 1 may be designed to have a similar structure, and the page buffer PB1 is described by way of example for convenience of description.

In an embodiment of the present disclosure, a page buffer that enables a triple-level cell (TLC) program operation is described by way of example.

Referring to FIG. 6, the page buffer PB1 may include a bit line controller 131, a bit line discharger 132, a sensing node precharger 133, a sub-latch component 134, and first to third latch components 135, 136, and 137.

The bit line controller 131 may selectively precharge bit lines BL1 to BLm before a verify voltage is applied to a memory cell array (e.g., 110 of FIG. 1) during a program verify operation. This operation is defined as a bit line setup operation. The bit line controller 131 may control the potential level of a sensing node SO based on the amount of current of the bit line BL1 that changes with the program state of a memory cell that is coupled to the bit line BL1 after the verify voltage has been applied to the memory cell array (e.g., 110 of FIG. 1) during the program verify operation. This operation is defined as an evaluation operation.

The bit line controller 131 may include a plurality of NMOS transistors N1 and N3 to N6 and a plurality of PMOS transistors P1 and P2.

The NMOS transistor N1 may be coupled between the bit line BL1 and a node ND1 and may electrically connect the bit line BL1 to the node ND1 in response to a page buffer select signal PBSEL.

The NMOS transistor N3 may be coupled between the node ND1 and a common sensing node CSO and may electrically connect the node ND1 to the common sensing node CSO in response to a page buffer sensing signal PB_SENSE.

The PMOS transistor P1 and the PMOS transistor P2 may be coupled in series between a source of a supply voltage VDD and the sensing node SO and may be turned on in response to a signal at a node QS of the sub-latch component 134 and a precharge signal SA_PRECH_N, respectively.

The NMOS transistor N4 may be coupled between the common sensing node CSO and a node that is between the PMOS transistor P1 and the PMOS transistor P2 and may provide the supply voltage VDD, provided through the PMOS transistor P1, to the common sensing node CSO in response to a control signal SA_CSOC.

The NMOS transistor N5 may be coupled between the sensing node SO and the common sensing node CSO and may electrically connect the sensing node SO to the common sensing node CSO in response to a transmission signal TRANSO.

The NMOS transistor N6 may be coupled between the common node CSO and a node ND2 of the sub-latch component 134 and may electrically connect the common node CSO to the node ND2 in response to a discharge signal SA_DISCH.

The operation of the bit line controller 131 that is performed during the bit line setup operation is described below.

The PMOS transistor P1 may be turned on or turned off based on the potential of the node QS of the sub-latch component 134. The potential of the node QS may be controlled based on data to be programmed or the verification data that is latched based on the result of the program verify operation. For example, when the verification data that is latched in the sub-latch component 134 corresponds to a pass as a result of the program verify operation, the node QS may have a logic high level, and the PMOS transistor P1 may be turned off in response to the potential of the node QS. In contrast, when the verification data that is latched in the sub-latch component 134 corresponds to a fail as a result of the program verify operation, the node QS may have a logic low level, and the PMOS transistor P1 may be turned on in response to the potential of the node QS. The verification data that is latched in the sub-latch component 134 may be the verification data that is latched based on the result of the program verify operation that is included in a previous program loop.

The NMOS transistor N4 may be turned on in response to the control signal SA_CSOC, the NMOS transistor N3 may be turned on in response to the page buffer sensing signal PB_SENSE, and the NMOS transistor N1 may be turned on in response to the page buffer select signal PBSEL. Therefore, based on the potential of the node QS of the sub-latch component 134, the bit line BL1 may be precharged to a supply voltage level or controlled to a ground voltage level during the program verify operation.

That is, page buffers, which correspond to memory cells that are determined to have failed as a result of the program verify operation in the previous program loop, may precharge the bit lines to the supply voltage level, and page buffers, which correspond to memory cells that are determined to have passed as a result of the program verify operation in the previous program loop, may maintain the bit lines at the ground voltage level without precharging the bit lines. The reason for this is to selectively perform a program verify operation only on the memory cells that are determined to have failed as a result of the program verify operation in the previous program loop.

The operation of the bit line controller 131 that is performed during an evaluation operation is described below.

The PMOS transistor P1 and the PMOS transistor P2 may precharge the sensing node SO to the level of the supply voltage VDD in response to both the signal at the node QS of the sub-latch component 134, which is set to a logic low level, and the precharge signal SA_PRECH_N at a logic low level.

The NMOS transistor N4 may be turned on in response to the control signal SA_CSOC, the NMOS transistor N5 may be turned on response to the transmission signal TRANSO with a logic high level, and the common sensing node CSO may be precharged to a certain level VDD−Vth.

The PMOS transistor P2 may be turned off in response to the precharge signal SA_PRECH_N that has made a transition to a logic high level, and the supply voltage VDD that is applied to the sensing node SO may be blocked. The potential levels of the sensing node SO and the common sensing node CSO may change based on the program state of the memory cell that is coupled to the bit line BL1. For example, when the threshold voltage of the memory cell is higher than a verify voltage that is applied to the word line of the memory cell during the program verify operation, current might not flow through the bit line BL1. Accordingly, the potentials of the common sensing node CSO and the sensing node SO may be maintained at a precharge level. In contrast, when the threshold voltage of the memory cell is lower than the verify voltage that is applied to the word line of the memory cell during the program verify operation, current may flow through the bit line BL1. Accordingly, the potentials of the common sensing node CSO and the sensing node SO may be decreased from the precharge level to a discharge level (e.g., SA_CSOC−Vth).

The bit lines that correspond to the memory cells that are determined to have passed during the program verify operation of the previous program loop may be controlled to be at the ground voltage during a bit line setup operation. Accordingly, the sensing node SO of each of the page buffers that correspond to the memory cells that are determined to have passed during the above-described evaluation operation may be decreased to the discharge level.

The bit line discharger 132 may be coupled to the node ND1 of the bit line controller 131 to discharge the potential level of the bit line BL1.

The bit line discharger 132 may include an NMOS transistor N2 that is coupled between the node ND1 and a source of ground power VSS, and the NMOS transistor N2 may apply the ground power VSS to the node ND1 in response to a bit line discharge signal BL_DIS.

The sensing node precharger 133 may be coupled between the sensing node SO and the source of the supply voltage VDD to precharge the sensing node SO to the level of the supply voltage VDD.

The sensing node precharger 133 may include a PMOS transistor P3, and the PMOS transistor P3 may apply the supply voltage VDD to the sensing node SO in response to a sensing node precharge signal PRECHSO_N.

The sub-latch component 134 may include a plurality of NMOS transistors N7 to N11 and inverters IV1 and IV2.

The inverters IV1 and IV2 may be coupled, in parallel, but in opposite directions, between the node QS and a node QS_N, thereby forming a latch.

The NMOS transistor N7 and the NMOS transistor N8 may be coupled in series between the sensing node SO and the source of ground power VSS. The NMOS transistor N7 may be turned on in response to a transmission signal TRANS, and the NMOS transistor N8 may be turned on or off based on the potential level of the node QS.

The NMOS transistor N9 may be coupled between the node QS and the node ND3 and may then electrically couple the node QS to the node ND3 in response to a reset signal SRST. The NMOS transistor N10 may be coupled between the node QS_N and the node ND3 and may then electrically couple the node QS_N to the node ND3 in response to a set signal SSET. The NMOS transistor N11 may be coupled between the node ND3 and the source of the ground power VSS and may be turned on based on the potential of the sensing node SO to electrically couple the node ND3 to the source of the ground power VSS. For example, when the reset signal SRST is applied as a logic high level signal to the NMOS transistor N9 in the state in which the sensing node SO is precharged to a high level, the node QS and the node QS_N may be initialized to a logic low level and a logic high level, respectively. Further, when the set signal SSET is applied as a logic high level signal to the NMOS transistor N10 in the state in which the sensing node SO is precharged to a logic high level, the node QS and the node QS_N may be set to a logic high level and a logic low level, respectively. During a data sensing operation, the node QS may be set to a logic low level.

During the program verify operation of the program operation, the sub-latch component 134 may latch the verification data. For example, during the program verify operation, when the potential level of the sensing node SO is changed by the bit line controller 131, the sub-latch component 134 may generate and latch the verification data based on the potential level of the sensing node SO. For example, when the threshold voltage of a target memory cell that is coupled to the bit line BL1 is lower than the verify voltage, the target memory cell may be turned on, and thus, the potential level of the sensing node SO may be discharged. In contrast, when the threshold voltage of a target memory cell that is coupled to the bit line BL1 is higher than the verify voltage, the target memory cell may be turned off, and thus, the potential level of the sensing node SO may be maintained at the precharge level (i.e., supply voltage level). The NMOS transistor N10 may be turned on in response to the set signal SSET, and the NMOS transistor N11 may be turned on or off based on the potential level of the sensing node SO to latch the verification data. For example, when the sub-latch component 134 latches the verification data that corresponds to a fail as a result of the verify operation, the node QS may have a logic low level, and the node QS_N may have a logic high level. However, when the sub-latch component 134 latches the verification data that corresponds to a pass as a result of the verify operation, the node QS may have a logic high level, and the node QS_N may have a logic low level.

Each of the first to third data latch components 135, 136, and 137 may be coupled to the sensing node SO.

The first data latch component 135 may temporarily store Least Significant Bit (LSB) data, among pieces of data to be programmed to the memory cell, during the program operation.

The first data latch component 135 may include a first data latch LAT1 and an NMOS transistor N12. The first data latch LAT1 may temporarily store the LSB data. The NMOS transistor N12 may be coupled between the first data latch LAT1 and the sensing node SO and may transmit the LSB data that is stored in the first data latch LAT1 to the sensing node SO in response to a first transmission signal TRAN1. That is, the NMOS transistor N12 may control the potential level of the sensing node SO based on the LSB data that is stored in the first data latch LAT1.

The second data latch component 136 may temporarily store Central Significant Bit (CSB) data, among the pieces of data to be programmed to the memory cell, during the program operation.

The second data latch component 136 may include a second data latch LAT2 and an NMOS transistor N13. The second data latch LAT2 may temporarily store the CSB data. The NMOS transistor N13 may be coupled between the second data latch LAT2 and the sensing node SO and may transmit the CSB data that is stored in the second data latch LAT2 to the sensing node SO in response to a second transmission signal TRAN2. That is, the NMOS transistor N13 may control the potential level of the sensing node SO based on the CSB data that is stored in the second data latch LAT2.

The third data latch component 137 may temporarily store Most Significant Bit (MSB) data, among the pieces of data to be programmed to the memory cell, during the program operation.

The third data latch component 137 may include a third data latch LAT3 and an NMOS transistor N14. The third data latch LAT3 may temporarily store the MSB data. The NMOS transistor N14 may be coupled between the third data latch LAT3 and the sensing node SO and may transmit the MSB data that is stored in the third data latch LAT3 to the sensing node SO in response to a third transmission signal TRAN3. That is, the NMOS transistor N14 may control the potential level of the sensing node SO based on the MSB data that is stored in the third data latch LAT3.

Although it is illustrated and described that the page buffer includes three data latch components 135, 136, and 137 in the embodiment of the present disclosure, the number of data latch components may be designed to be adjusted based on the number of bits that can be stored in one memory cell. For example, the page buffer may be configured such that, when two bits of data can be stored in one memory cell, two data latch components are included in one page buffer, and when four bits of data can be stored in one memory cell, four data latch components are included in one page buffer.

Figure 7:
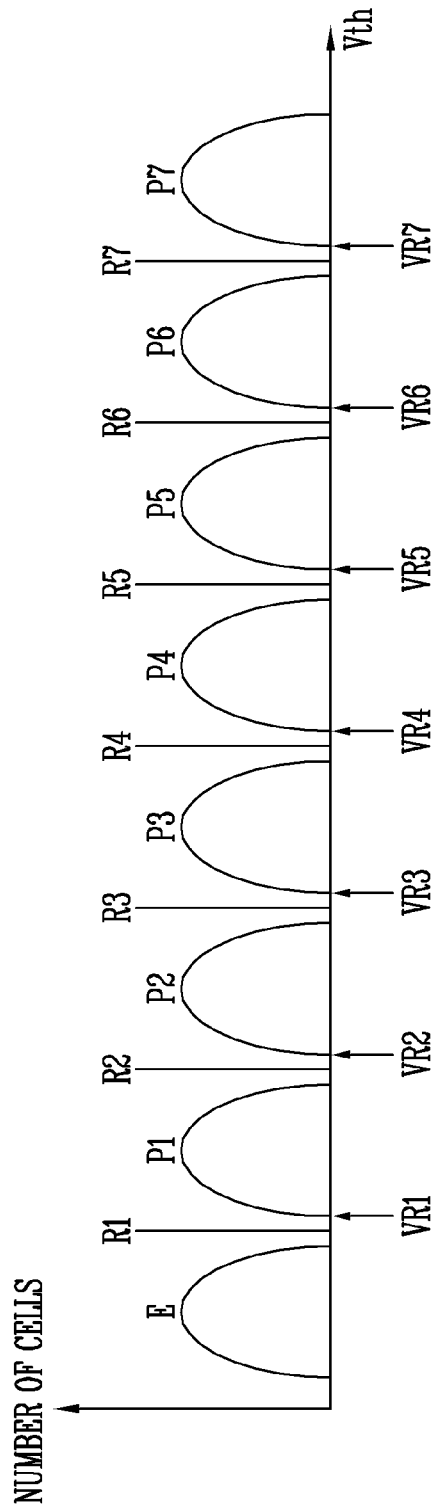
FIG. 7 is a graph illustrating program states of triple-level cells.

FIG. 7 is a graph illustrating program states of triple-level cells.

Referring to FIG. 7, triple-level cells (TLC) have threshold voltage states that respectively correspond to one erased state E and seven program states P1 to P7. The erased state E and the first to seventh program states P1 to P7 have bit codes that correspond thereto. If necessary, various bit codes may be assigned to the erased state E and the first to seventh program states P1 to P7.

For example, a bit code in which LSB/CSB/MSB are 1/1/1 may be assigned to the erased state E, a bit code in which LSB/CSB/MSB are 1/1/0 may be assigned to the first program state P1, a bit code in which LSB/CSB/MSB are 1/0/0 may be assigned to the second program state P2, a bit code in which LSB/CSB/MSB are 0/0/0 may be assigned to the third program state P3, a bit code in which LSB/CSB/MSB are 0/1/0 may be assigned to the fourth program state P4, a bit code in which LSB/CSB/MSB are 0/1/1 may be assigned to the fifth program state P5, a bit code in which LSB/CSB/MSB are 0/0/1 may be assigned to the sixth program state P6, and a bit code in which LSB/CSB/MSB are 1/0/1 may be assigned to the seventh program state P7.

Respective threshold voltage states may be identified based on first to seventh read voltages R1 to R7. Also, first to seventh verify voltages VR1 to VR7 may be used to determine whether the programming of memory cells that correspond to respective program states has been completed.

For example, in order to verify memory cells that correspond to the second program state P2, among memory cells that are included in a selected physical page, the second verify voltage VR2 may be applied to the corresponding word line. Here, the page buffer PB1, illustrated in FIG. 6, may determine whether the programming of a target memory cell that is coupled to the bit line BL1 is complete or incomplete by sensing the current of the bit line BL1.

Although, in FIG. 7, target program states of triple-level cells are illustrated, they are merely exemplary, and a plurality of memory cells that are included in the semiconductor memory device according to an embodiment of the present disclosure may be multi-level cells (MLC). In an embodiment, the plurality of memory cells that are included in the semiconductor memory device according to the embodiment of the present disclosure may be quad-level cells (QLC).

Figure 8:
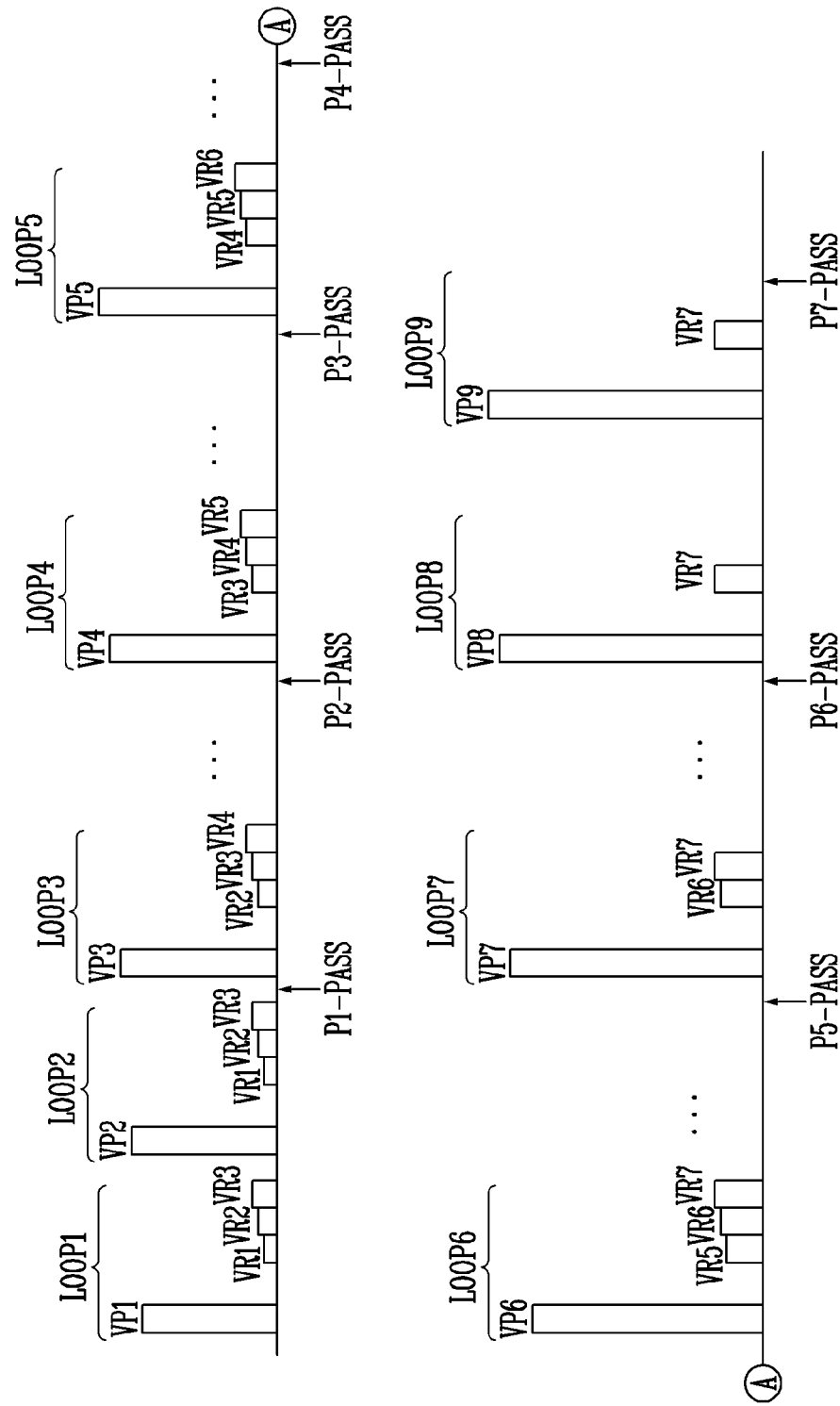
FIG. 8 is a diagram for explaining a program operation according to an embodiment of the present disclosure.

FIG. 8 is a diagram for explaining a program operation according to an embodiment of the present disclosure.

In an embodiment of the present disclosure, the case in which memory cells are programmed using a triple-level cell (TLC) scheme is described by way of example.

The program operation according to the embodiment of the present disclosure is described with reference to FIGS. 7 and 8.

Referring to FIGS. 7 and 8, an embodiment in which a program operation for first to seventh program states P1 to P7 is performed according to an embodiment of the present disclosure is illustrated. The program operation may be performed such that a plurality of program loops LOOP1 to LOOP9 that correspond to the first to seventh program states P1 to P7 are sequentially performed. For example, the program loops LOOP1 and LOOP2 may correspond to the first program state P1, and the program loop LOOP3 may correspond to the second program state P2. Further, the program loop LOOP4 may correspond to the third program state P3, the program loop LOOP5 may correspond to the fourth program state P4, the program loop LOOP6 may correspond to the fifth program state P5, the program loop LOOP7 may correspond to the sixth program state P6, and the program loops LOOP8 and LOOP9 may correspond to the seventh program state P7.

Each of the plurality of program loops LOOP1 to LOOP9 may include a program pulse apply operation and at least one program verify operation. As a result of the program verify operation that is included in each program loop, when the number of memory cells that have completed the program operation, among memory cells to be programmed to a program state that corresponds to the program loop, is equal to or greater than a preset number, the program operation may be determined to have passed, and a program loop for the next program state may be performed. For example, when, as a result of the program verify operation in the program loop LOOP2, it is determined that the program operation for the first program state P1 has passed (P1-PASS), the program loop LOOP3 for the next program state (e.g., the second program state) may be performed.

Figure 9:
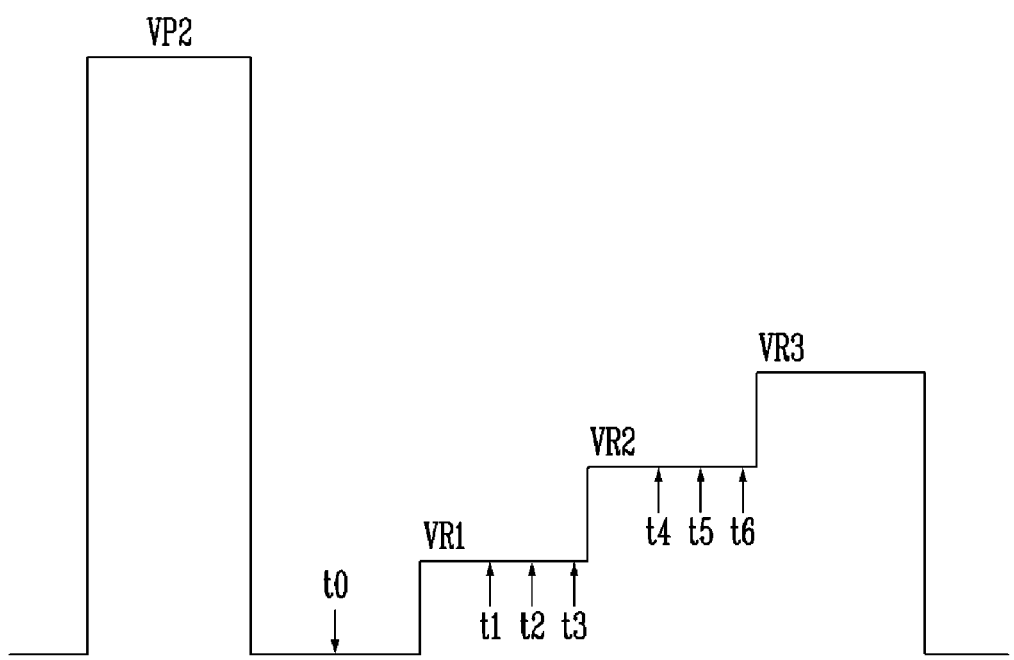
FIG. 9 is a diagram for explaining one of a plurality of program loops in FIG. 8.

FIG. 9 is a diagram for explaining one of a plurality of program loops in FIG. 8.

FIGS. 10A to 10G are diagrams for explaining data values of a node QS_N of a sub-latch component and a sensing node SO during a plurality of program verify operations that are successively performed.

The operation of the page buffer that is performed during a plurality of program verify operations that are included in one program loop is described below with reference to FIGS. 1, 5, 6, 7, 8, 9, and 10A to 10G.

In an embodiment of the present disclosure, the program loop LOOP2 of FIG. 8 is described by way of example.

During a program operation, each of the plurality of page buffers PB1 to PBm of the read and write circuit 130 may receive data to be programmed to memory cells (e.g., MC1) that are included in a selected physical page of a selected memory block (e.g., BLK3) and may temporarily store the received data. For example, LSB data, CSB data, and MSB data of the data to be programmed may be temporarily stored in the first to third latch components 135, 136, and 137 of each of the plurality of page buffers PB1 to PBm.

Each of the plurality of page buffers PB1 to PBm may apply a program inhibition voltage or a program permission voltage to corresponding bit lines BL1 to BLm based on the result of the last program verify operation in a previous program loop (e.g., LOOP1).

The voltage generator 150 may generate and output a program voltage Vpgm (VP2), and the address decoder 120 may apply the program voltage Vpgm (VP2) to the word line (e.g., WL1) that corresponds to the selected physical page.

At time t0, the node QS_N of the sub-latch component 134 may have a node value, as illustrated in FIG. 10A, based on the verification data that corresponds to the result of the previous program verify operation. When the program loop currently being performed is the first program loop LOOP1 of the program operation, the node QS_N of the sub-latch component 134 may have an initial setting value.

For example, when the target program state of the memory cell MC1 that corresponds to the page buffer (e.g., PB1) is an erased state E, the node QS_N of the page buffer PB1 may be set to the value of "0", which corresponds to a logic low level.

In the case in which the target program states of the memory cell MC1 that corresponds to the page buffer PB1 are first to seventh program states P1 to P7, when the program operation is determined to have failed (FAIL-MC) in a previous program verify operation, the node QS_N of the page buffer PB1 may be set to a value of "1", which corresponds to a logic high level. However, when the program operation is determined to have passed (PASS-MC) in the previous program verify operation, the node QS_N of the page buffer PB1 is set to a value of "0".

Thereafter, the plurality of page buffers PB1 to PBm may precharge respective bit lines to a preset level or maintain the respective bit lines at a ground voltage level based on the potential of the node QS. For example, page buffers, which correspond to memory cells that are determined to have failed as a result of the program verify operation in the previous program loop, may precharge the bit lines to the supply voltage level, and page buffers, which correspond to memory cells that are determined to have passed as a result of the program verify operation in the previous program loop, may maintain the bit lines at the ground voltage level without precharging the bit lines.

Thereafter, a program verify operation that corresponds to the first program state P1 may be performed.

During the program verify operation that corresponds to the first program state P1, the voltage generator 150 may generate and output a verify voltage VR1 that corresponds to the first program state P1, and the address decoder 120 may apply the verify voltage VR1 to the word line WL1 that corresponds to the selected physical page.

Accordingly, each of the bit lines BL1 may be maintained at a precharge level based on the program state of the memory cell MC1 that is included in the selected physical page or may be discharged to a certain level due to the occurrence of a current flow.

For example, when the threshold voltage of the memory cell MC1 is higher than the verify voltage VR1, current might not flow through the bit line that corresponds to the memory cell MC1. Accordingly, the potentials of the common sensing node CSO and the sensing node SO may be maintained at a precharge level. In contrast, when the threshold voltage of the memory cell MC1 is lower than the verify voltage VR1, current may flow through the bit line that corresponds to the memory cell MC1. Accordingly, the potentials of the common sensing node CSO and the sensing node SO may be decreased from the precharge level to a discharge level. Also, the bit lines that correspond to memory cells that are determined to have passed as a result of the program verify operation in the previous program loop may be maintained at the ground voltage level without a precharge operation, and thus, the potential of the sensing node SO of each of the page buffers that correspond to the bit lines may also be decreased to the discharge level. Accordingly, at time t1, the sensing node SO of each of the plurality of page buffers PB1 to PBm has a node value such as that illustrated in FIG. 10B. Here, "1" is a node value that corresponds to the precharge level, and "0" is a node value that corresponds to the discharge level. That is, when the threshold voltage of the memory cell MC1 is higher than the verify voltage VR1 (FAIL-MC), the sensing node SO may have a value of "1." However, when the threshold voltage of the memory cell MC1 is lower than the verify voltage VR1 (PASS-MC), the sensing node may have a value of "0".

Thereafter, at time t2, the plurality of page buffers PB1 to PBm may perform a masking operation. For example, among the plurality of page buffers PB1 to PBm, each of page buffers, for which the target program state of the corresponding memory cell is any of program states (e.g., P2 to P7) with a threshold voltage distribution that is higher than that of the program state P1 that corresponds to the program verify operation currently being performed, may set the node value of the sensing node SO to "0", as illustrated in FIG. 10C. For example, the node value of the sensing node SO of each of the page buffers for program states (e.g., P2 to P7), with a threshold voltage distribution that is higher than that of the program state P1 that corresponds to the program verify operation currently being performed based on the data that is stored in the first to third data latch components 135, 136, and 137, among the plurality of page buffers PB1 to PBm, is set to "0".

Thereafter, at time t3, the sub-latch component 134 may latch the verification data, as illustrated in FIG. 10D, based on the node value of the sensing node SO. Here, the sub-latch component 134 of each of the page buffers for the program states (e.g., P2 to P7), with a threshold voltage distribution that is higher than that of the program state P1 that corresponds to the program verify operation currently being performed, may maintain a previously latched data value based on the node value of the sensing node SO, which is set to "0", at time t2. That is, the page buffers for the program states (e.g., P2 to P7) with a threshold voltage distribution that is higher than that of the program state P1 that corresponds to the program verify operation currently being performed do not reflect the results of the program verify operation currently being performed.

Thereafter, a program verify operation that corresponds to a next program state (e.g., P2) is performed.

During the program verify operation that corresponds to the second program state P2, the voltage generator 150 may generate and output a verify voltage VR2 that corresponds to the second program state P2, and the address decoder 120 may apply the verify voltage VR2 to the word line WL1 that corresponds to the selected physical page.

Accordingly, each of the bit lines BL1 may be maintained at a precharge level based on the program state of the memory cells MC1 that are included in the selected physical page or may be discharged to a certain level due to the occurrence of a current flow.

For example, when the threshold voltage of the memory cell MC1 is higher than the verify voltage VR2, current might not flow through a bit line that corresponds to a memory cell MC1. Accordingly, the potentials of the common sensing node CSO and the sensing node SO may be maintained at a precharge level. In contrast, when the threshold voltage of the memory cell MC1 is lower than the verify voltage VR2, current may flow through the bit line that corresponds to the memory cell MC1. Accordingly, the potentials of the common sensing node CSO and the sensing node SO may be decreased from the precharged state to a discharge level. Accordingly, at time t4, the sensing node SO of each of the plurality of page buffers PB1 to PBm has a node value such, as illustrated in FIG. 10E. That is, when the threshold voltage of the memory cell MC1 is higher than the verify voltage VR2 (FAIL-MC), the sensing node SO may have a value of "1." However, when the threshold voltage of the memory cell MC1 is lower than the verify voltage VR2 (PASS-MC), the sensing node may have a value of "0".

Thereafter, at time t5, the plurality of page buffers PB1 to PBm may perform a masking operation. For example, among the plurality of page buffers PB1 to PBm, each of page buffers, for which the target program state of the corresponding memory cell is any of program states (e.g., P3 to P7) with a threshold voltage distribution that is higher than that of the program state P2 that corresponds to the program verify operation currently being performed, may set the node value of the sensing node SO to "0", as illustrated in FIG. 10F. For example, the node value of the sensing node SO of each of the page buffers for program states (e.g., P3 to P7), with a threshold voltage distribution that is higher than that of the program state P2 that corresponds to the program verify operation currently being performed based on the data that is stored in the first to third data latch components 135, 136, and 137, among the plurality of page buffers PB1 to PBm, is set to "0".

Thereafter, at time t6, the sub-latch component 134 may latch the verification data, as illustrated in FIG. 10G, based on the node value of the sensing node SO. Here, the sub-latch component 134 of each of the page buffers for the program states (e.g., P3 to P7), with a threshold voltage distribution that is higher than that of the program state P2 that corresponds to the program verify operation currently being performed, may maintain a previously latched data value based on the node value of the sensing node SO, which is set to "0" at time t5. That is, the page buffers for the program states (e.g., P3 to P7) with a threshold voltage distribution that is higher than that of the program state P2 that corresponds to the program verify operation currently being performed do not reflect the results of the program verify operation currently being performed.

After the verify operation that corresponds to the above-described second program state P2, a verify operation for the next program state, that is, the third program state P3, may be performed in a manner similar to that of the second program state P2. That is, after a verify voltage VR3 is applied to the selected word line WL1, a masking operation of setting the sensing node SO of each of the page buffers that temporarily stores data that corresponds to the program states P4 to P7, higher than the third program state P3, to a data value of "0" may be performed during an evaluation operation, after which the verification data may be latched in the sub-latch component 134 based on the node value of the sensing node SO.

As described above, when data to be programmed, which corresponds to the program state with a threshold voltage distribution that is lower than or equal to that of the program state that corresponds to a program verify operation currently being performed, is temporarily stored, the plurality of page buffers PB1 to PBm may latch the verification data, based on the node value of the sensing node SO in which the results of the evaluation operation are reflected, in the sub-latch component 134. Further, when data to be programmed, which corresponds to the program state with a threshold voltage distribution that is higher than that of the program state that corresponds to a program verify operation currently being performed, is temporarily stored, the plurality of page buffers PB1 to PBm may perform a masking operation of setting the value of the sensing node SO to a specific node value during an evaluation operation. As a result, the sub-latch component 134 of the page buffer in which the masking operation is performed may maintain a previously latched data value in the previous program loop without latching the verification data that corresponds to the result of the program verify operation currently being performed.

In this way, even if program verify operations that correspond to the plurality of program states are successively performed, the plurality of page buffers PB1 to PBm may perform the program verify operations without requiring an operation of moving the data that is latched in the sub-latch component 134 to another storage. Due thereto, the program operation speed of the semiconductor memory device may be improved.

In the above-described embodiment, the case in which program verify operations, starting from a program verify operation that uses a low verify voltage, are sequentially performed when the plurality of program verify operations are sequentially performed has been described as an example. However, the present disclosure is not limited thereto, and program verify operations that range from a program verify operation that uses a higher verify voltage to a program verify operation that uses a lower verify voltage may be performed may be performed. For example, in the program loop LOOP1, a program verify operation that uses the third verify voltage VR3 may be performed, and a program verify operation that uses the second verify voltage VR2 may then be performed, after which a program verify operation that uses the first verify voltage VR1 may be performed.

Figure 11:
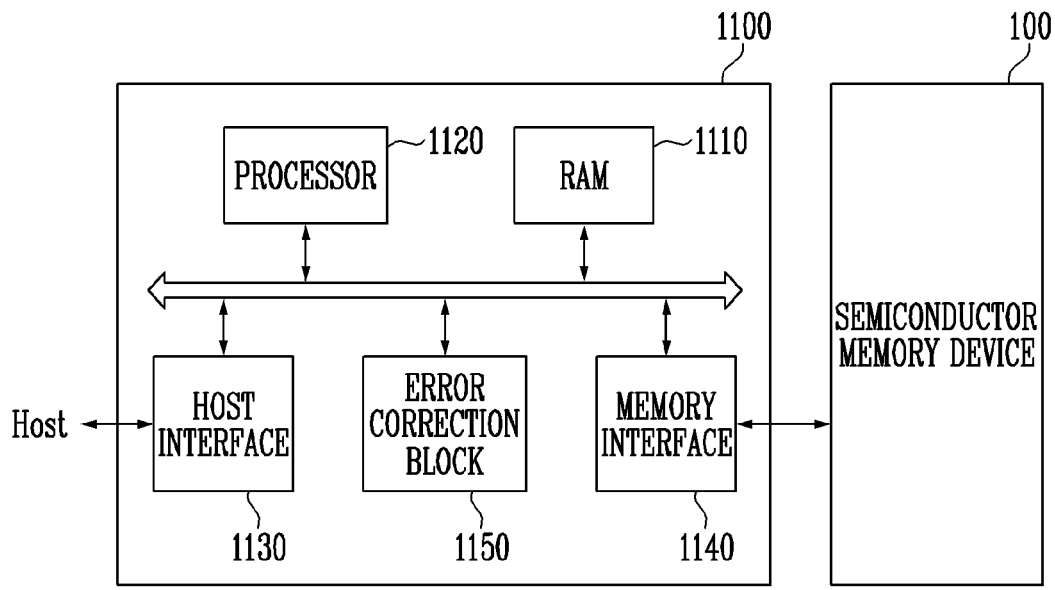
FIG. 11 is a block diagram illustrating an embodiment 1000 of a memory system including the semiconductor memory device of FIG. 1.

FIG. 11 is a block diagram illustrating an embodiment 1000 of a memory system including the semiconductor memory device of FIG. 1.

Referring to FIG. 11, the memory system 1000 may include the semiconductor memory device 100 and a controller 1100. The semiconductor memory device 100 may be the semiconductor memory device described with reference to FIG. 1. Hereinafter, repetitive explanations will be omitted.

The controller 1100 may be coupled to a host Host and the semiconductor memory device 100. The controller 1100 may access the semiconductor memory device 100 in response to a request from the host Host. For example, the controller 1100 may control read, write, erase, and background operations of the semiconductor memory device 100. The controller 1100 may provide an interface between the semiconductor memory device 100 and the host Host. The controller 1100 may run firmware for controlling the semiconductor memory device 100.

The controller 1100 may include a random access memory (RAM) 1110, a processor 1120, a host interface 1130, a memory interface 1140, and an error correction block 1150. The RAM 1110 may be used as at least one of a working memory for the processor 1120, a cache memory between the semiconductor memory device 100 and the host Host, and a buffer memory between the semiconductor memory device 100 and the host. The processor 1120 may control the overall operation of the controller 1100. In addition, the controller 1100 may temporarily store program data provided from the host Host during a program operation.

The host interface 1130 may include a protocol for performing data exchange between the host Host and the controller 1100. In an embodiment, the controller 1100 may communicate with the host Host through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, and a private protocol.

The memory interface 1140 may interface with the semiconductor memory device 100. For example, the memory interface may include a NAND interface or NOR interface.

The error correction block 1150 may detect and correct errors in data received from the semiconductor memory device 100 using an error correction code (ECC). The processor 1120 may adjust the read voltage based on the result of error detection by the error correction block 1150, and may control the semiconductor memory device 100 to perform re-reading. In an embodiment, the error correction block may be provided as an element of the controller 1100.

The controller 1100 and the semiconductor memory device 100 may be integrated into a single semiconductor device. In an embodiment, the controller 1100 and the semiconductor memory device 100 may be integrated into a single semiconductor device to form a memory card. For example, the controller 1100 and the semiconductor memory device 100 may be integrated into a single semiconductor device to form a memory card, such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The controller 1100 and the semiconductor memory device 100 may be integrated into a single semiconductor device to form a solid state drive (SSD). The SSD includes a storage device configured to store data in a semiconductor memory. When the memory system 1000 is used as the SSD, an operation speed of the host Host that is coupled to the memory system 1000 may be remarkably improved.

In an embodiment, the memory system 1000 may be provided as one of various elements of an electronic device, such as a computer, an ultra mobile PC (UMPC), a workstation, a net-book, a personal digital assistant (PDA), a portable computer, a web tablet, a wireless phone, a mobile phone, a smartphone, an e-book, a portable multimedia player (PMP), a game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, a radio frequency identification (RFID) device, or one of various elements for forming a computing system.

In an embodiment, the semiconductor memory device 100 or the memory system 1000 may be mounted in various types of packages. For example, the semiconductor memory device 100 or the memory system 1000 may be packaged and mounted in various ways, such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), or Wafer-Level Processed Stack Package (WSP).

Figure 12:
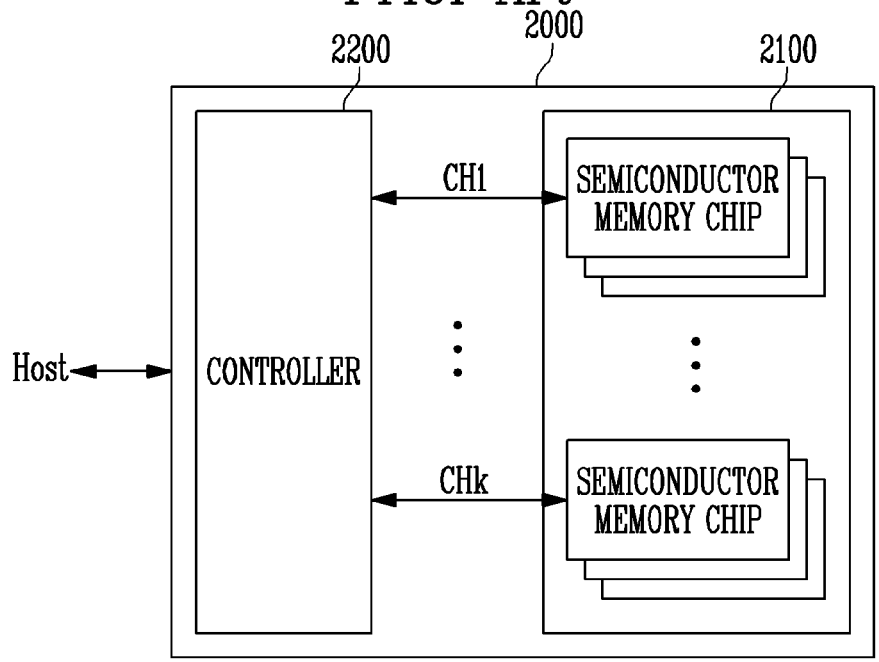
FIG. 12 is a block diagram illustrating an example of application of the memory system of FIG. 11.

FIG. 12 is a block diagram illustrating an example of application of the memory system of FIG. 11.

Referring to FIG. 12, the memory system 2000 may include the semiconductor memory device 2100 and a controller 2200. The semiconductor memory device 2100 may include a plurality of semiconductor memory chips. The semiconductor memory chips are divided into a plurality of groups.

In FIG. 12, it is illustrated that the plurality of groups communicate with the controller 2200 through first to k-th channels CH1 to CHk. Each semiconductor memory chip may be configured and operated in the same manner as those of the semiconductor memory device 100 described with reference to FIG. 1.

Each group may communicate with the controller 2200 through one common channel. The controller 2200 may have the same configuration as the controller 1100, described with reference to FIG. 11, and may control the plurality of memory chips of the semiconductor memory device 2100 through the plurality of channels CH1 to CHk.

Figure 13:
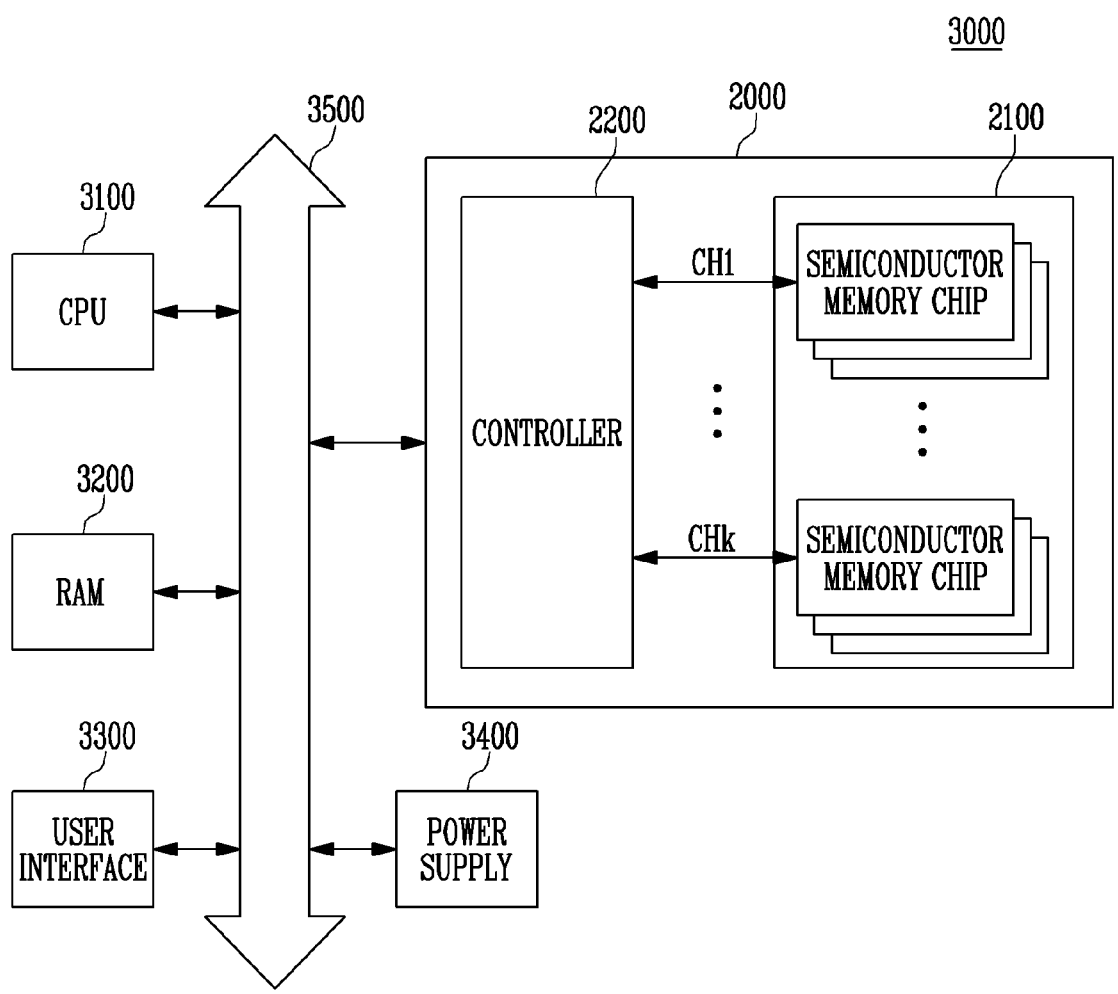
FIG. 13 is a block diagram illustrating a computing system including the memory system described with reference to FIG. 12.

FIG. 13 is a block diagram illustrating a computing system including the memory system described with reference to FIG. 12.

A computing system 3000 may include a central processing unit (CPU) 3100, a RAM 3200, a user interface 3300, a power supply 3400, a system bus 3500, and a memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 13, a semiconductor memory device 2100 may be illustrated as being coupled to the system bus 3500 through the controller 2200. However, the semiconductor memory device 2100 may be directly coupled to the system bus 3500. Here, the function of the controller 2200 may be performed by the CPU 3100 and the RAM 3200.

In FIG. 13, the memory system 2000 described with reference to FIG. 12 is illustrated as being provided. However, the memory system 2000 may be replaced with the memory system 1000 described with reference to FIG. 11. In an embodiment, the computing system 3000 may include both the memory systems 1000 and 2000 described with reference to FIGS. 11 and 12.

In accordance with the present disclosure, pieces of data that correspond to the results of a plurality of program verify operations that are successively performed during a program operation of a semiconductor memory device may be accumulated in page buffers so that the plurality of program verify operations may be performed without requiring an operation of moving pieces of data that corresponds to the results of respective program verify operations. Thus, the time required for the program operation may be shortened.

The embodiments disclosed in the present specification and the drawings aims to help those with ordinary knowledge in this art more clearly understand the present disclosure rather than aiming to limit the bounds of the present disclosure. Therefore, one of ordinary skill in the art to which the present disclosure belongs will be able to easily understand that various modifications are possible based on the technical scope of the present disclosure.

What is claimed is:

1. A page buffer, comprising:
    a plurality of data latch components coupled to a sensing node, the plurality of data latch components configured to store program data;
    a bit line controller coupled between a bit line and the sensing node, the bit line controller configured to control a node value of the sensing node based on a program state of a memory cell that is coupled to the bit line during a present program verify operation which is being performed; and
    a sub-latch component configured to latch verification data indicating a result of the present program verify operation based on the node value of the sensing node,
    wherein each of the plurality of data latch components sets the node value of the sensing node to a first logic value based on the program data after controlling the node value of the sensing node, in response that a threshold voltage distribution of a target program state of the memory cell is higher than a threshold voltage distribution of a program state corresponding to the present program verify operation, and
    wherein the target program state corresponds to the program data.

2. The page buffer according to claim 1, wherein the sub-latch component configured to latch the verification data in response to completing the present program verify operation in a state in which previous verification data, latched in response to completing a previous program verify operation that is performed before the present program verify operation, is stored.

3. The page buffer according to claim 2, wherein the previous program verify operation and the present program verify operation are sequentially performed.

4. The page buffer according to claim 2, wherein the sub-latch component is configured to maintain the previous verification data when the sensing node is set to the first logic value.

5. The page buffer according to claim 1, wherein each of the plurality of data latch components is configured to store any one of Least Significant Bit (LSB) data, Central Significant Bit (CSB) data, and Most Significant Bit (MSB) data of the data to be programmed to the memory cell.

6. The page buffer according to claim 1, wherein the bit line controller is configured to precharge the bit line or controls the bit line to a ground voltage level based on the previous verification data that is latched in the sub-latch component during the previous program verify operation before the present program verify operation is performed.

7. A semiconductor memory device, comprising:
    a memory block including a plurality of memory cells;
    a plurality of page buffers coupled to a plurality of bit lines of the memory block; and
    a voltage generator configured to apply a program voltage to a selected word line of the memory block during a program pulse apply operation and configured to apply a verify voltage to the selected word line during a program verify operation,
    wherein each of the plurality of page buffers is configured to:
        temporarily store program data to be programmed to any one memory cell of the plurality of memory cells,
        control a node value of a sensing node based on a program state of the any one memory cell during the program verify operation which is being performed,
        latch verification data indicating a result of the program verify operation based on the node value of the sensing node, and
        set the node value of the sensing node to a specific value based on the program data after controlling the node value of the sensing node, in response that a threshold voltage distribution of a target program state of the any one memory cell is higher than a threshold voltage distribution of a program state corresponding to the program verify operation, and wherein the target program state corresponds to the program data.

8. The semiconductor memory device according to claim 7, wherein each of the plurality of page buffers comprises:
a plurality of data latch components coupled to the sensing node and configured to store the program data;
a bit line controller coupled between any one bit line of the plurality of bit lines and the sensing node, the bit line controller configured to control the node value of the sensing node based on the program state of the any one memory cell that is coupled to the any one bit line during the program verify operation; and
a sub-latch component configured to latch the verification data based on the node value of the sensing node in response to completing the program verify operation.

9. The semiconductor memory device according to claim 8, wherein the sub-latch component configured to latch the verification data in response to completing the program verify operation in a state in which previous verification data, latched in response to completing a previous program verify operation that is performed before the program verify operation, is stored.

10. The semiconductor memory device according to claim 9, wherein the previous program verify operation and the program verify operation are sequentially performed.

11. The semiconductor memory device according to claim 9, wherein the sub-latch component is configured to maintain the previous verification data when the sensing node is set to the specific value.

12. The semiconductor memory device according to claim 8, wherein each of the plurality of data latch components is configured to store any one of Least Significant Bit (LSB) data, Central Significant Bit (CSB) data, and Most Significant Bit (MSB) data of the data to be programmed to the memory cell.

13. The semiconductor memory device according to claim 8, wherein the bit line controller is configured to precharge the bit line or controls the bit line to a ground voltage level based on the previous verification data that is latched in the sub-latch component during the previous program verify operation before the program verify operation is performed.

14. A method of operating a semiconductor memory device, comprising:
storing program data in a plurality of page buffers;
applying a program permission voltage or a program inhibition voltage to bit lines that are coupled to memory cells based on the program data that is stored in the plurality of page buffers;
applying a program voltage to a word line of the memory cells;
selectively precharging the bit lines based on previous verification data that is stored in a sub-latch component of each of the plurality of page buffers;
applying a first verify voltage that corresponds to a first program state to the word line;
controlling a node value of a sensing node of each of the plurality of page buffers based on a program state of each of the memory cells;
determining a first page buffer group storing first program data corresponding to a high program state which is higher than the first program state and a second page buffer group storing second program data corresponding to a low program state which is equal to or lower than the first program state among the plurality of page buffers;
setting node values of the sensing nodes of the first page buffer group to a specific value and maintaining node values of the sensing nodes of the second page buffer group; and
latching verification data to the sub-latch component of each of the plurality of page buffers or maintaining the previous verification data based on the node value of the sensing node of each of the plurality of page buffers.

15. The method according to claim 14, further comprising:
applying a second verify voltage that corresponds to a second program state to the word line;
controlling the node value of the sensing node of each of the plurality of page buffers based on the program state of each of the memory cells;
setting the node value of the sensing node to the specific value or maintaining the node value of the sensing node based on the program data that is stored in each of the plurality of page buffers; and
latching new verification data or maintaining the verification data based on the node value of the sensing node.

16. The method according to claim 14, wherein a threshold voltage distribution of the high program state is higher than a threshold voltage distribution of the first program state.

17. The method according to claim 16, wherein a threshold voltage distribution of the low program state is equal to or lower than the threshold voltage distribution of the first program state.

18. The method according to claim 14, wherein, when the node value of the sensing node is set to the specific value, the previous verification data that is latched during a previous program verify operation is maintained, and
wherein, when the node value of the sensing node is maintained, the verification data is latched based on the node value of the sensing node.

* * * * *